(12) United States Patent
Wong

(10) Patent No.: US 7,755,413 B2
(45) Date of Patent: Jul. 13, 2010

(54) COMBINATION OF ANALOG AND DIGITAL FEEDBACK FOR ADAPTIVE SLEW RATE CONTROL

(75) Inventor: Koon Lun Wong, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 24 days.

(21) Appl. No.: 12/153,692

(22) Filed: May 22, 2008

(65) Prior Publication Data

US 2009/0289683 A1 Nov. 26, 2009

(51) Int. Cl.
*H03K 17/296* (2006.01)
(52) U.S. Cl. .................. 327/393; 327/396; 327/538
(58) Field of Classification Search .................. None
See application file for complete search history.

(56) References Cited

U.S. PATENT DOCUMENTS 6,956,413 B2 * 10/2005 Bailey .................. 327/131
7,439,789 B2 * 10/2008 Nguyen .................. 327/308
7,570,035 B2 * 8/2009 Kleveland .................. 323/276

OTHER PUBLICATIONS

Fetzer, E.S., "Using Adaptive Circuits to Mitigate Process Variations in a Microprocessor Design," *Design of Test of Computers, IEEE*, Jun. (2006), pp. 476-483, vol. 23 (6).
Garcia, F. et al., "Design of a slew rate controlled output buffer," *ASIC Conference*, Sep. 1998, pp. 147,150.

Kurahashi, P. et al., "Design of Low-Voltage Highly Linear Switched-R-MOSFET-C Filters," *IEEE Journal of Solid-State Circuits*, Aug. 2007, pp. 1699-1709, vol. 42 (8).

(Continued)

*Primary Examiner*—An T Luu
(74) *Attorney, Agent, or Firm*—Sterne, Kessler, Goldstein & Fox P.L.L.C.

(57) ABSTRACT

An apparatus for scaling a load device with frequency in a phase interpolator can include an analog loop and a digital loop. The load device of the phase interpolator can include a transistor and a plurality of resistors selectively configured in parallel with the transistor. The analog loop controls a resistance of the transistor based on a voltage applied to a control terminal of the transistor. For instance, the analog loop can tune the resistance of a PMOS device by adjusting a voltage applied to the PMOS device's gate terminal. In addition, the analog loop can include a comparator to compare a voltage across the transistor to a reference voltage such that an optimal voltage is maintained for an output swing of the phase interpolator. The analog loop can also include a low pass filter coupled to an output of the comparator to define frequency stability and loop bandwidth of the analog loop. The digital loop operates in conjunction with the analog loop and controls the plurality of resistors by incrementing or decrementing a number of resistors that are configured in parallel with the transistor in the load device. In combining the analog and digital loops to control the load device of the phase interpolator, this configuration takes advantage of the wide tuning range of the digital control and the smooth, continuous output of the analog control. Further, in operating the analog and digital loops in conjunction with each other, the present invention avoids a long observation time in locking the system, as seen in conventional designs, while guaranteeing frequency stability in the operation of both the analog and digital loops.

26 Claims, 9 Drawing Sheets

OTHER PUBLICATIONS

Messerschmitt, D.G., "Frequency detectors for PLL acquisition in timing and carrier recovery," *IEEE Trans. Comm*, Sep. (1979), pp. 1288-1295, vol. COM-27.

Razavi, B., "Phase-Locking in High Performance Systems From Devices to Architectures," *Wiley-IEEE Press*, New Jersey, 2003.

Sayed, A. H., "Fundamentals of Adapting Filtering," *Wiley-IEEE Press*, New Jersey, First Edition, 2003.

Yang, C.-K. K., "Delay-locked loops-an overview," in B. Razavi, "Phase-Locking in High-Performance Systems From Devices to Architectures," 2003, pp. 13-22.

* cited by examiner

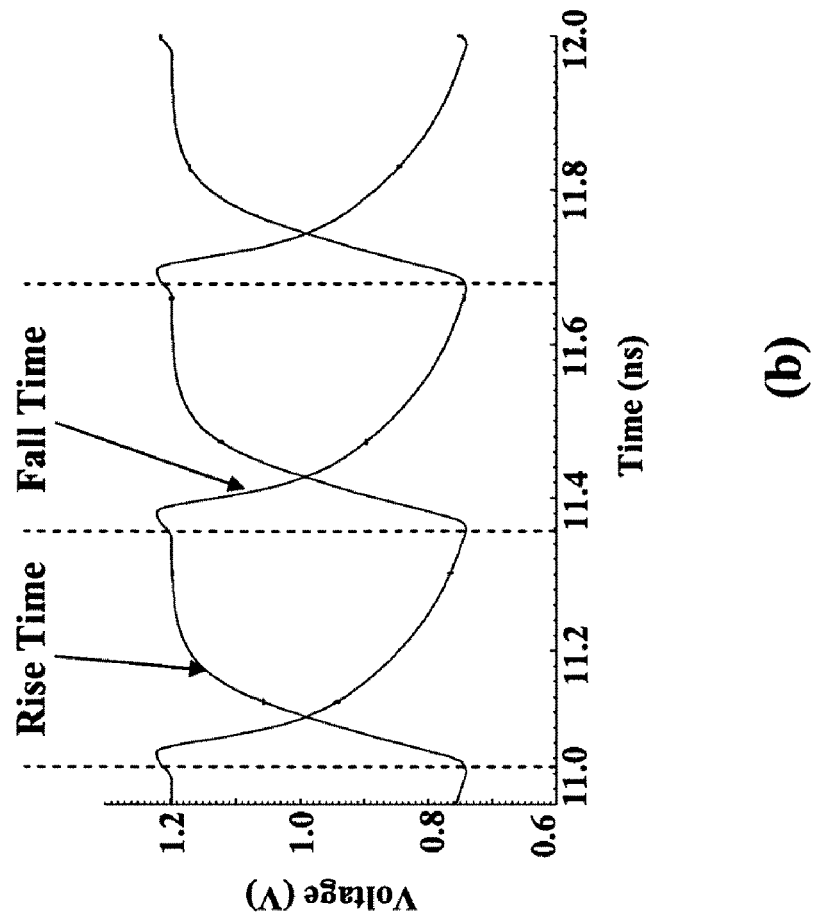
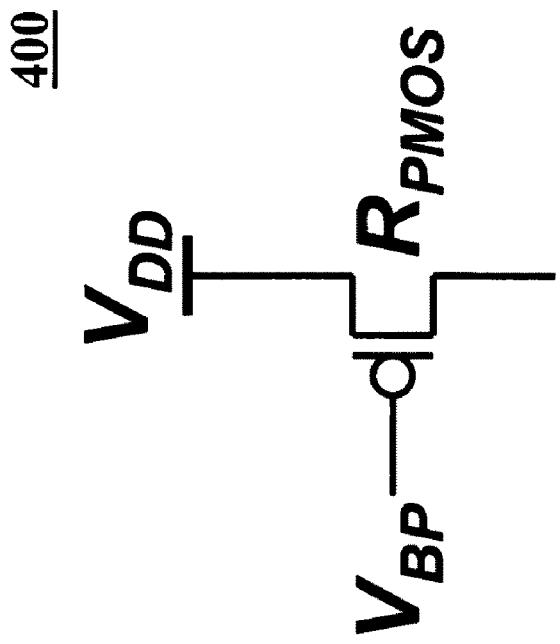
(a)
(Conventional)
Figure 4

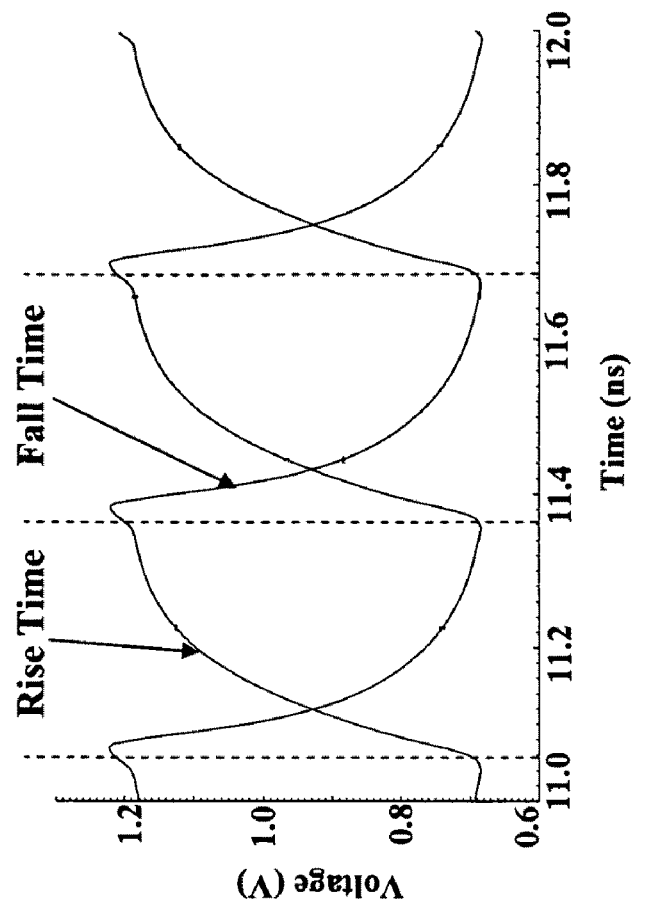
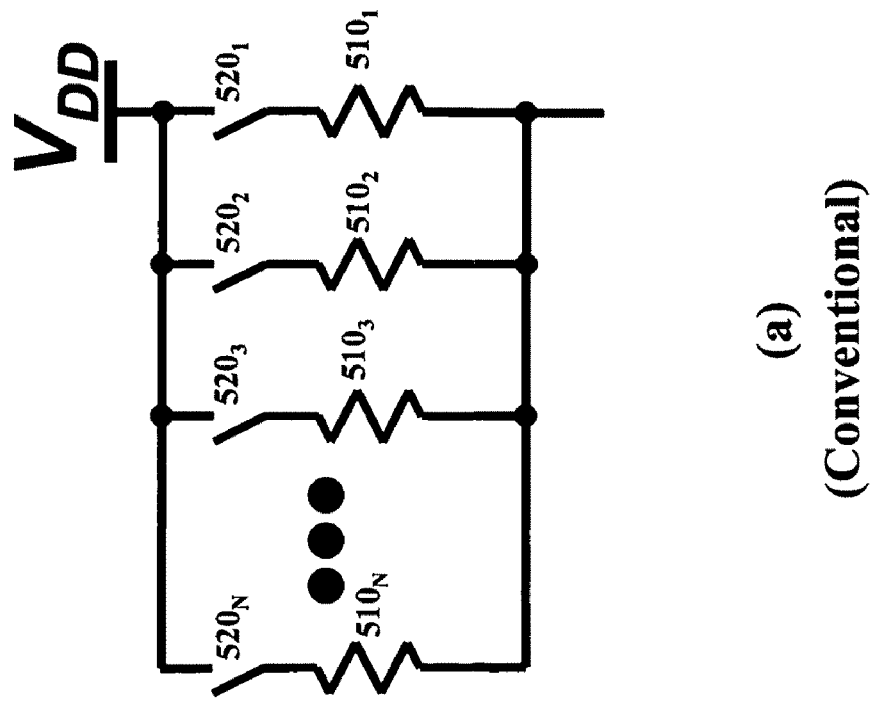
(a)
(Conventional)
Figure 5

COMBINATION OF ANALOG AND DIGITAL FEEDBACK FOR ADAPTIVE SLEW RATE CONTROL

BACKGROUND

1. Field

The present invention generally relates to the field of self-adaptation circuit design. More specifically, the present invention relates to scaling a load device with frequency in a phase interpolator.

2. Background

Phase interpolators are important components in high-speed timing circuits, where clock and data recovery (CDR) must be performed before data can be decoded. In general, in a clock recovery system, a reference clock signal of a particular clock frequency is generated together with a number of different clock signals with the same frequency but with different phases. A conventional method to generate a number of clocks with the same frequency but with different phases is to use a voltage controlled delay loop (VCDL). Phase interpolators can be implemented to interpolate between delay stages in the VCDL to generate finer phase spacing, thus creating more clock signals. These clock signals are compared to the phase and frequency of an incoming data stream, where one or more clock signals are selected for data recovery.

FIG. 1(a) illustrates a conventional phase interpolator 100 with $a_0$- and $a_1$-weighted current sources. Parameters $a_0$ and $a_1$ refer to a number of pair transistors 111 and 121 (e.g., current tail sources), respectively, connected to each other in parallel, where an amount of current generated by differential pairs 10 and 120 varies according to the number of pair transistors 111 and 121. For instance, phase interpolator 100 can have input signals $\Phi_0$ and $\Phi_1$ that are 45° apart. The phase output of phase interpolator 100 can be varied using a current summation of differential pairs 110 and 120. That is, for a given ratio of $a_0:a_1$, a phase output from phase interpolator 100 varies. For example, as illustrated in FIG. 1(b), a ratio of $a_0:a_1=4:4$ can result in a 22.5° phase output, a ratio of $a_0:a_1=7:1$ can result in a 5.7° phase output, and a ratio of $a_0:a_1=1:7$ can result in a 39.4° phase output.

A design consideration of phase interpolator 100 is the slew rate of its phase output. For instance, as illustrated in FIG. 2, if a slew rate of input signal $\Phi_0$ is too fast, a weighted sum of the ratio $a_0:a_1$ becomes highly non-linear at output 210. In order to ensure proper phase interpolation with a relatively linear phase output (with respect to current weighting ratio $a_0:a_1$), the time constant of the phase output ($\tau_{PI}$) should be at least twice the time separation ($\Delta T$) between the two input phases $\Phi_0$ and $\Phi_1$ ($\tau_{PI} > 2 \cdot \Delta T$). This relation sets a lower bound of the phase output time constant. Conversely, the time constant should not be too large because this reduces the frequency bandwidth and output swing of phase interpolator 100. Since the time constant is inversely proportional to frequency ($\tau_{PI} \propto 1/f$), the operating frequency of phase interpolator 100 sets an upper bound of the phase output time constant. These lower and upper bound time constant constraints dictate the frequency range of phase interpolator 100.

What is needed is a method or apparatus for scaling a phase interpolator output's slew rate with operating frequency such that a wide range of operating frequency can be achieved.

SUMMARY

In order for a phase interpolator to operate in a wide range of frequencies, an apparatus, method, and system for scaling a load device with frequency in the phase interpolator is introduced. In an embodiment, an apparatus for scaling the load device with frequency includes an analog loop to control a resistance of a transistor in the load device based on a voltage applied to a control terminal of the transistor and a digital loop, operating in conjunction with the analog loop, to control a plurality of resistors in the load device, where the plurality of resistors are selectively coupled to the transistor. The apparatus can also include one or more current sources coupled to both the transistor and plurality of resistors. In an embodiment of the transistor, the transistor is a p-channel metal oxide semiconductor (PMOS) device whose resistance is tuned by a voltage applied to its gate terminal. Further, in an embodiment, the plurality of resistors are polysilicon resistors.

The analog loop can include a comparator to compare a voltage across the transistor to a reference voltage such that an optimal voltage is maintained for an output swing of the phase interpolator. The analog loop can also include a low pass filter coupled to an output of the comparator. The low pass filter can include a resistor and a capacitor to define a frequency stability and loop bandwidth of the analog loop. In an embodiment, the reference voltage is a predetermined voltage for an output swing of the phase interpolator.

The digital loop can include a first plurality of comparators to compare a voltage from an output of a comparator coupled to the analog loop to a first and second reference voltage and a second plurality of comparators to compare a time-delayed version of the output of the comparator coupled to the analog loop to the first and second reference voltages. The digital loop can also include a digital counter to increment or decrement a number of active resistors from the plurality of resistors, via digital switches, based on outputs from the first plurality of comparators and the second plurality of comparators. In an embodiment, the first and second reference voltages are an upper and lower voltage limit, respectively, for a gate voltage of a PMOS device.

An embodiment of a method for scaling a load device with frequency in a phase interpolator includes setting a resistance value of a plurality of resistors in the load device, where the plurality of resistors are selectively controlled by a digital loop and tuning the resistance of the load device to a finer resistance value than the resistance set by the plurality of resistors with a transistor whose resistance is controlled by an analog loop. In setting the resistance value of the load device, the plurality of resistors are selectively coupled to source and drain terminals of a PMOS device in a parallel configuration via digital switches. Further, in tuning the resistance of the load device, a voltage at a source/drain terminal of a PMOS device can be compared to a reference voltage. The reference voltage can equal a supply voltage of the phase interpolator minus a predetermined voltage drop across the PMOS device.

The method can also include maintaining a predetermined voltage for an output swing of the phase interpolator through the analog loop and maintaining an upper and lower voltage limit for the control terminal of the transistor through the digital loop. In maintaining the predetermined voltage for the output swing of the phase interpolator, no device enters triode region during operation. Further, in maintaining the upper and lower voltage limits for the control terminal of the transistor, this step can include the following: comparing an output of a comparator coupled to the analog loop to both an upper and lower voltage limit of a gate voltage of a PMOS device, where the PMOS device provides the finer resistance value; comparing a time-delayed version of the output of the comparator coupled to the analog loop to both the upper and lower voltage limits of the gate voltage of the PMOS device;

and, incrementing or decrementing a cycle count from an output of a digital counter coupled to the digital loop based on the results of the comparisons.

An embodiment of a system for scaling a load device with frequency in a phase interpolator includes a processor and a memory. The memory is in communication with the processor and can store processing instructions. These processing instructions can include setting a resistance value of a plurality of resistors in the load device, where the plurality of resistors are selectively controlled by a digital loop and tuning the resistance of the load device to a finer resistance value than the resistance set by the plurality of resistors with a transistor whose resistance is controlled by an analog loop. The processing instructions can also include maintaining a predetermined voltage for an output swing of the phase interpolator through the analog loop and maintaining an upper and lower voltage limit for the control terminal of the transistor through the digital loop.

Further embodiments, features, and advantages of the present invention, as well as the structure and operation of the various embodiments are described in detail below with reference to accompanying drawings.

BRIEF DESCRIPTION OF THE DRAWINGS

The present invention is illustrated by way of example, and not by way of limitation, in the figures of the accompanying drawings in which:

FIG. 4(a) is an illustration of a p-channel metal oxide semiconductor (PMOS) device used as a load device in a conventional phase interpolator.

FIG. 4(b) is an illustration of an example graph of rise and fall times of a PMOS device used as a load device in a conventional phase interpolator.

FIG. 5(a) is an illustration of an array of resistors used as a load device in a conventional phase interpolator.

FIG. 5(b) is an illustration of an example graph of rise and fall times of an array of resistors used as a load device in a conventional phase interpolator.

Figure 1:
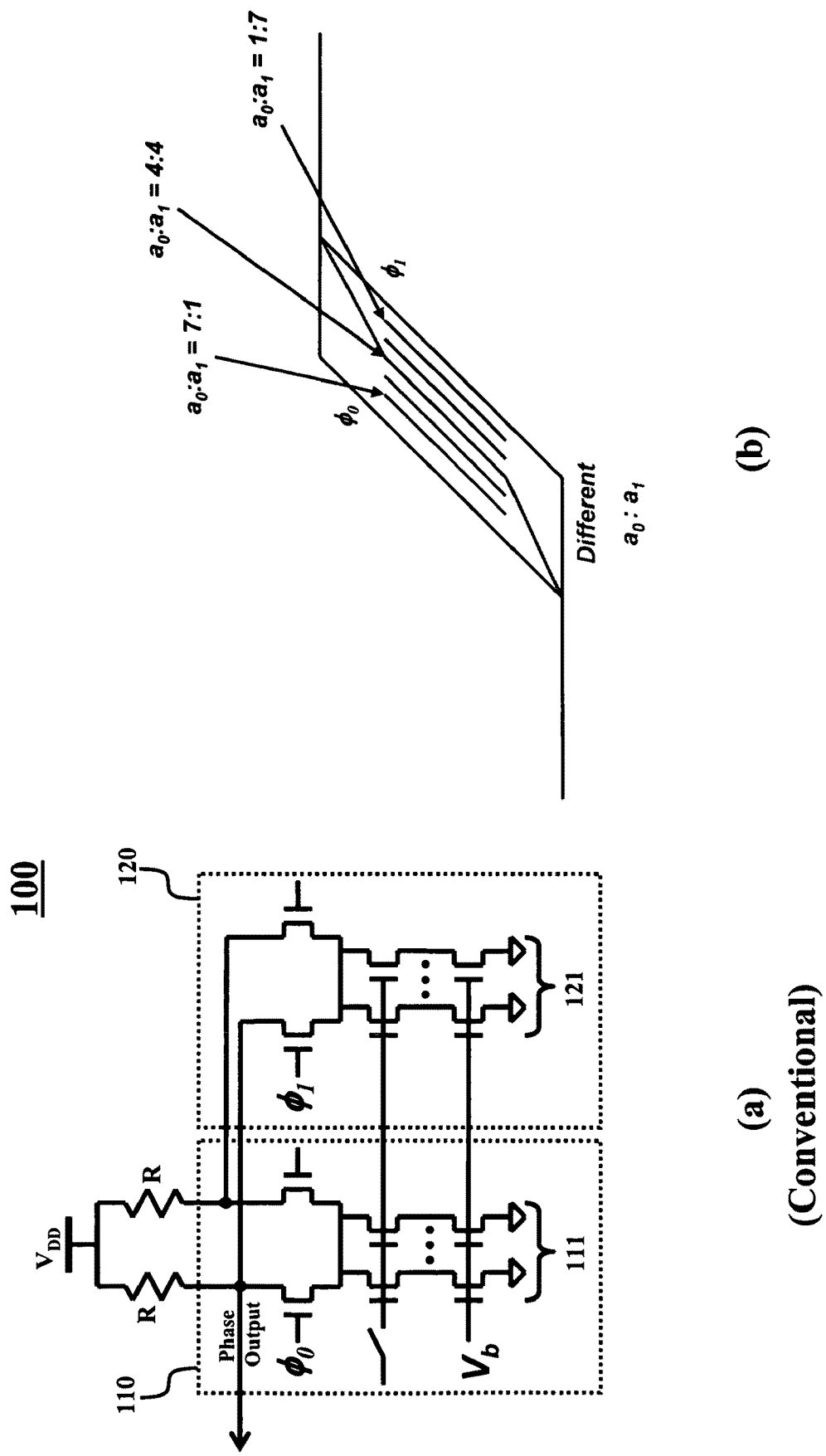
FIG. 1(a) is an illustration of a conventional phase interpolator.
FIG. 1(b) is an illustration of phase outputs according to various weights placed on current sources of a conventional phase interpolator.
Figure 2:
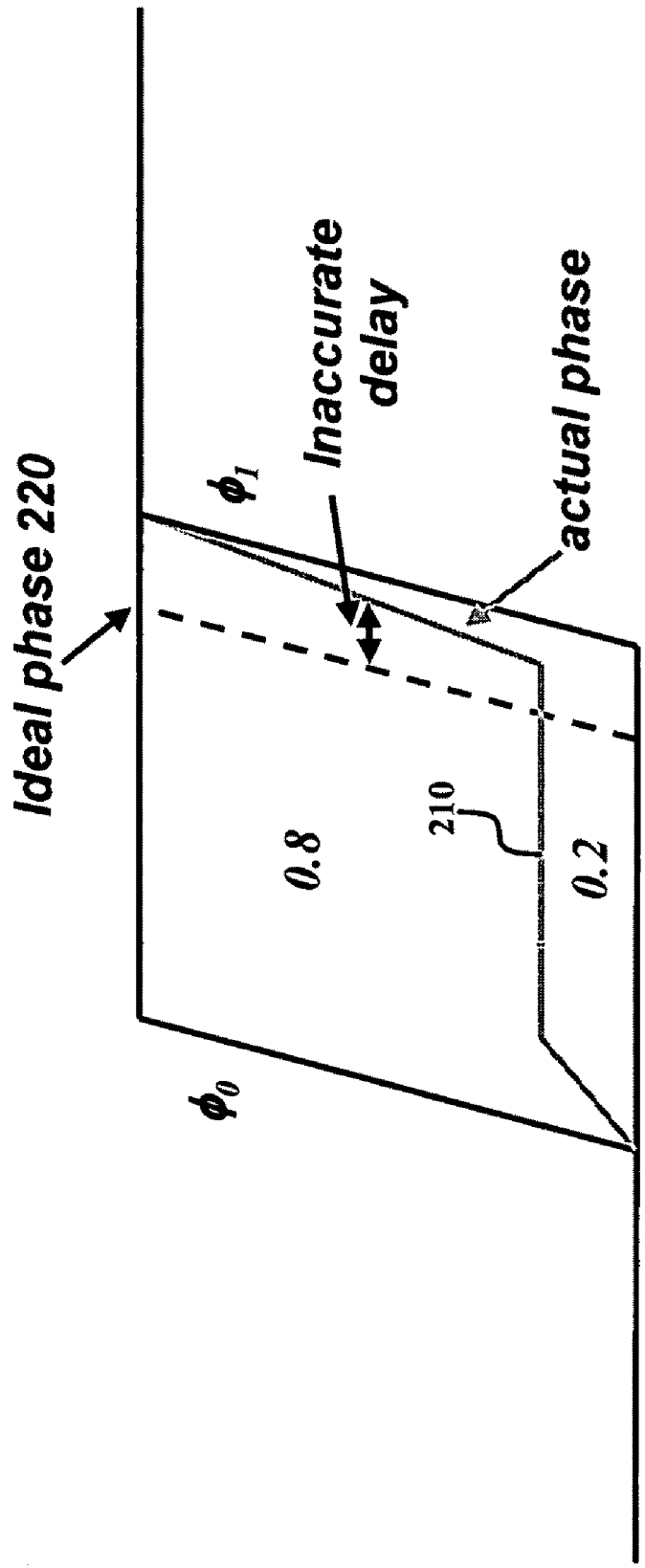
FIG. 2 is an illustration of an inaccurate slew rate in a phase output of a conventional phase interpolator when the slew rate of an input signal is too fast.

The present invention will now be described with reference to the accompanying drawings. In the drawings, generally, like reference numbers indicate identical or functionally similar elements. Additionally, generally, the left-most digit(s) of a reference number identifies the drawing in which the reference number first appears

DETAILED DESCRIPTION

Figure 3:
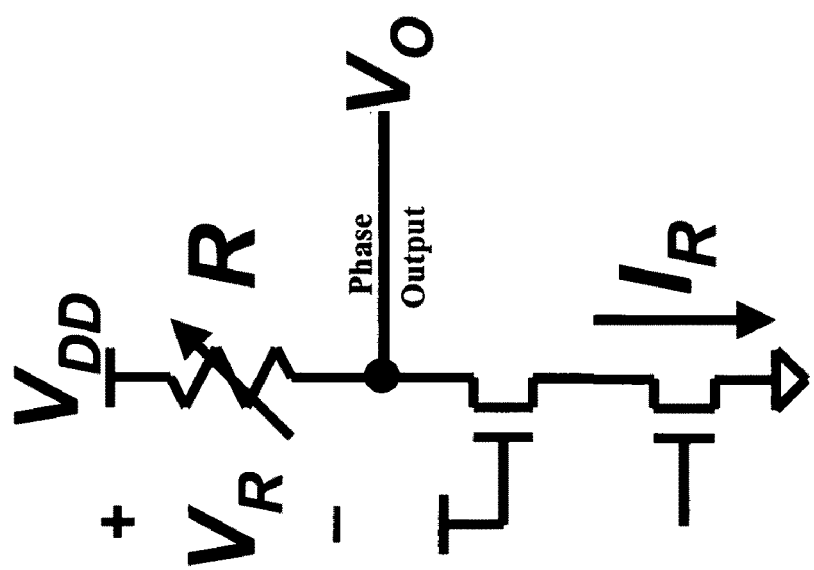
FIG. 3 is an illustration of a half replica of a differential pair used in a conventional phase interpolator.

One way to control the phase output slew rate of phase interpolator 100 is to vary resistance in the load device of differential pairs 110 and 120. For explanation purposes, FIG. 3 illustrates a half replica of differential pair 110 to be used as a reference to equations (1)-(3). Equations (1)-(3) show a relationship between the phase output time constant, load resistance, and operating frequency of phase interpolator 100.

$$\tau_{PI} = 2 \cdot \Delta T \propto 1/f \tag{1}$$

$$\tau_{PI} = R \cdot C \tag{2}$$

$$R \propto 1/f \tag{3}$$

where $\tau_{PI}$ is the minimum phase output time constant of phase interpolator 100, $\Delta T$ is the time separation between the two input phases $\Phi_0$ and $\Phi_1$, f is the operating frequency of phase interpolator 100, R is the load resistance of differential pair 110, and C is the capacitance at the phase output of phase interpolator 100.

Capacitance C (not shown in FIG. 3) is relatively constant during the operation of phase interpolator 100. As such, from equation (3), the load resistance is inversely proportional to operating frequency. According to Ohm's law, $$R = V_R / I_R \tag{4}$$

where $V_R$ is a potential difference across resistor R and $I_R$ is the current flowing through resistor R. Resistor R is also inversely proportional to $I_R$ for a fixed $V_R$. In view of equations (3) and (4), current $I_R$ is directly proportional to operating frequency f. In a current-starved voltage controlled oscillator (VCO), an oscillating frequency, f, is proportional to $I_{VCO}/C_{VCO}$, where $I_{VCO}$ is a current entering the VCO, and $C_{VCO}$ is an effective capacitance of the VCO. As a result, $I_{VCO}$ can substitute $I_R$ in equation (4) to provide the following:

$$R = V_R / I_{VCO}. \tag{5}$$

As oscillating frequency changes, $I_{VCO}$ changes accordingly, where R is inversely proportional to frequency (given that $V_R$ is constant).

It is desirable to optimize the design of phase interpolator 100 by taking into consideration several performance factors such as output swing and operating frequency. Output swing refers to a range of output voltages from which phase interpolator 100 can operate over a range of input conditions. The output swing is simply the potential difference built across the load resistance, $V_R$. The value of $V_R$ is determined by the circuit design of phase interpolator 100 so that the differential pair does not enter triode region. Although equations (3) and (5) provide a relative relationship between R, $I_{VCO}$, and f, $I_{VCO}$ cannot be arbitrarily low due to power considerations. If $I_{VCO}$ is too low, R is large for a constant $V_R$. A large R value leads to a slow slew rate, $\tau_{PI}$ (see equation (2)). Moreover, a slow slew rate can lead to insufficient phase interpolator bandwidth, which in turn reduces the output swing of the clock waveform. For a reasonable bandwidth, the slew rate can be chosen to be $\tau_{PI}=2*(1/(8*f))$ so that the output swing is not significantly degraded, while meeting a lower bound set for proper phase interpolation. With these conditions, R and $I_{VCO}$ can be determined for a given C, which is dominated by parasitics in the system. Thus, in order to reduce the power consumption in the phase interpolator system, C should be minimized.

A conventional method to scale load resistor R is to use a metal oxide semiconductor (MOS) device. For example, as illustrated in FIG. 4(a), a p-channel metal oxide semiconductor (PMOS) device 400 can be used. A resistance $R_{PMOS}$ can be varied according to a gate voltage $V_{BP}$ applied to PMOS device 400 as known by persons of ordinary skill in the relevant art. For wide frequency ranges (e.g., 100 MHz to 1.9 GHz), one drawback of PMOS device 400 is that its transconductance must be large, where supply noise can be amplified to its output. Another drawback of PMOS device 400 is that it has a very large parasitic capacitance, thus requiring a smaller $R_{PMOS}$ and larger $I_{VCO}$ to maintain the same time constant (i.e., $\tau_{PI}=R \cdot C$) and the same output swing ($V_R=R*I_R$). In addition, as illustrated in FIG. 4(b), device mismatches in the semiconductor fabrication process of PMOS device 400 results in a delay mismatch between two phase interpolators. Furthermore, the voltage dependent parasitic of the PMOS causes unequal rise and fall times.

Another conventional method to scale load resistor R is to use an array of resistors that can be selectively controlled by a switch. For example, as illustrated in FIG. 5(a), an array of polysilicon resistors $510_1$-$510_N$ can be selectively controlled by digital switches $520_1$-$520_N$. Digital switches $520_1$-$520_N$ switch resistors $510_1$-$520_N$, respectively, according to a particular resistor value required by the phase interpolator. As compared to PMOS device 400, resistors $510_1$-$510_N$ do not share the same parasitic capacitance issues and the same non-uniform rise and fall times as PMOS device 400. FIG. 5(b) illustrates the rise and fall time characteristics of resistors $510_1$-$510_N$. However, a disadvantage of the array of polysilicon resistors $510_1$-$510_N$ is resolution. Due to the discrete values of each polysilicon resistor, a large number of resistors and switches are required for higher resolution voltages, thus increasing circuit area. Another drawback of the array of polysilicon resistors $510_1$-$510_N$ is jitter induced into the phase interpolator when the load resistance is switched from one resistance value to another resistance value.

The present invention takes advantage of the analog and digital implementations described above with respect to FIGS. 4 and 5, respectively, to control slew rate in a phase interpolator. In particular, the present invention implements an array of resistors as a means to provide coarse slew control, while a transistor (e.g., a PMOS device) provides a means for fine slew control. The array of resistors provides coarse resistance values, thus reducing circuit area and associated parasitics as the number of resistors and switches are reduced as compared to a full digital implementation. Meanwhile, the gate voltage applied to the PMOS device provides a fine resistance value, thus avoiding the effects of noise in the digital settings of the array of resistors. The PMOS device occupies a small circuit area since it is used to cover a small fraction of the load device's tuning range. A small PMOS device also translates into smaller parasitics associated with the device as compared to a pure analog implementation.

In controlling the coarse and fine slew control of the analog and digital implementations, the present invention introduces an adaptation loop that can operate both the analog and digital components simultaneously while achieving a short locking time for the loop. Applications, such as phase lock loop (PLL) and CDR designs, implement both analog and digital feedback loops, where one loop is activated first and then after a lock detection has been established, the second loop is activated. For instance, in a CDR with rotational phase detection, a frequency detection is first performed with a digital feedback loop and, after a detection is locked, a phase detection is performed with an analog loop. A disadvantage of this loop configuration is the prolonged observation time to lock the digital loop and the activation time of the analog loop after the digital loop has been locked. Moreover, the tracking ability of this loop configuration is also a disadvantage because, once the digital loop is locked, it must also be unlocked when the analog loop is activated, thus impacting the overall locking time of the system. Unlike the analog and digital loop implementations that incorporate sequential lock and unlock mechanisms, the present invention incorporates a loop architecture that can operate both the analog and digital loops simultaneously when detecting a lock for the system, thus reducing overall locking time.

In the following description, for purposes of explanation, specific details are set forth in order to provide a thorough understanding of the present invention. It will be evident, however, to a person skilled in the relevant art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 6:
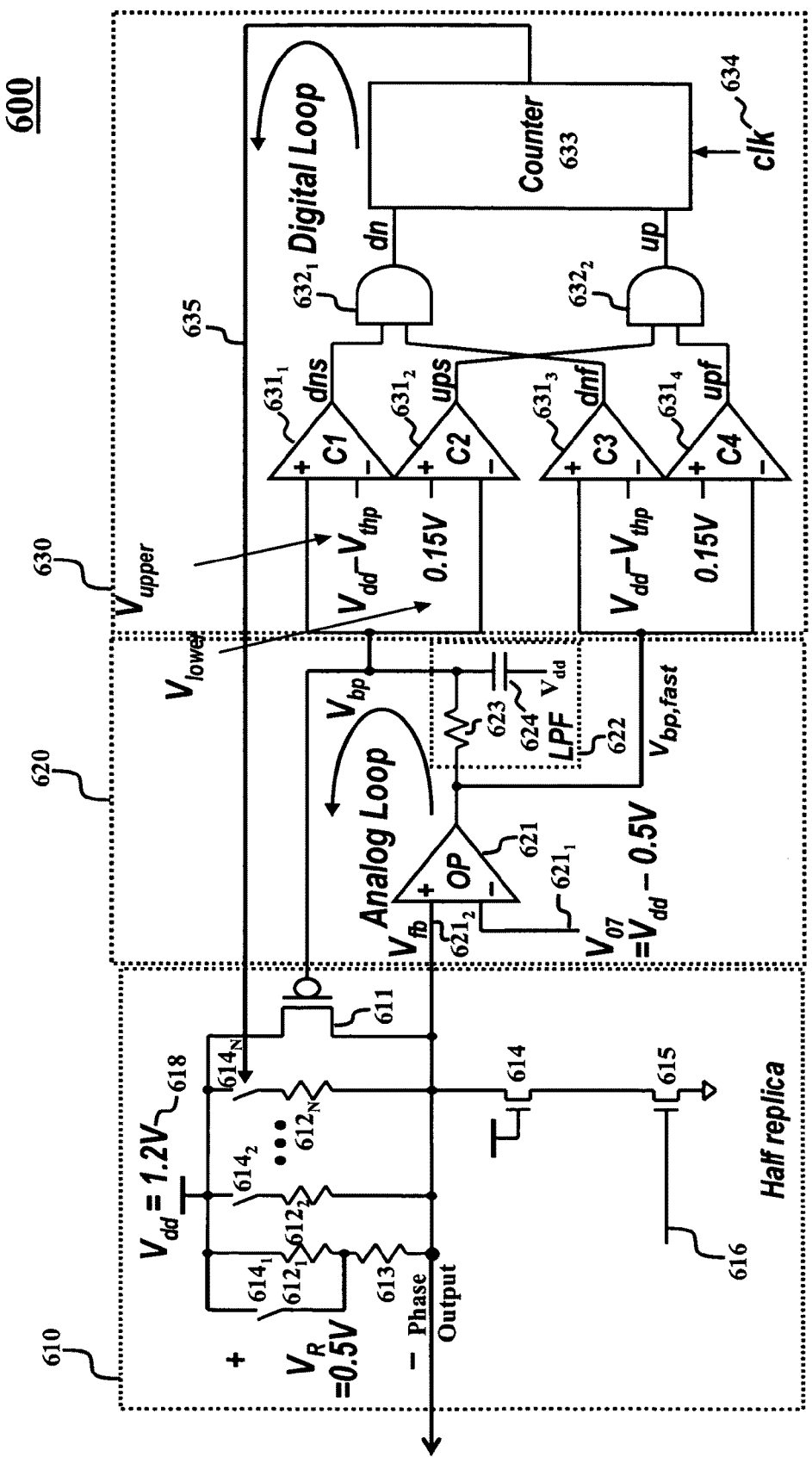
FIG. 6 is an illustration of an embodiment of an apparatus for scaling a load device with frequency in a phase interpolator in accordance with the present invention.

FIG. 6 is an illustration of an embodiment of an apparatus 600 for scaling a load device with frequency in a phase interpolator in accordance with the present invention. Apparatus 600 includes a half replica of a phase interpolator 610, an analog loop 620, and a digital loop 630. For simplicity, the half replica of phase interpolator 610 will be referred to as phase interpolator 610.

Phase interpolator 610 includes a transistor 611, an array of resistors $612_1$-$612_N$ and 613, and current source transistors 614 and 615. Phase interpolator 610 does not illustrate a transistor receiving a phase signal input (e.g., $\Phi_0$ or $\Phi_1$), as shown in FIG. 1, because the description of apparatus 600 focuses on the load device of phase interpolator 610 and a current flowing through the load device. However, a person of ordinary skill in the art will recognize that the description provided herein is applicable to a phase interpolator configuration that includes phase signal inputs (e.g., $\Phi_0$ and $\Phi_1$).

In an embodiment, transistor 611 is a PMOS device whose resistance varies according to a voltage applied to its gate terminal. In the alternative, transistor 611 can be other types of transistors as known by those persons of ordinary skill in the relevant art. These other types of transistors are within the scope and spirit of the present invention. For simplicity and ease of explanation, transistor 611 will be described in terms of a PMOS device and will be referred to as PMOS device 611.

In referring to phase interpolator 610 in FIG. 6, current source transistors 614 and 615 are configured in a cascaded configuration to provide a current source for phase interpolator 610. In particular, a voltage is applied to a gate terminal of transistor 615 to generate a current and transistor 614 is used to match the switches in the phase interpolator. The current generated by transistor 615 is a current mirror of the VCO current, $I_{VCO}$, which scales linearly with operating frequency. In the alternative, other current source configurations can be used in phase interpolator 610. Current sources are known to those persons of ordinary skill in the relevant art.

The resistor load of phase interpolator 610 includes PMOS device 611 and array of resistors $612_1$-$612_N$ and 613. As illustrated in FIG. 6, array of resistors $612_1$-$612_N$ and 613 are placed in a parallel configuration with PMOS device 611. In addition, resistor $612_1$ is placed in series with resistor 613 to provide additional resolution in resistance values to the array of resistors. Array of resistors $612_1$-$612_N$ and 613 provide coarse resistance settings for phase interpolator 610 such that, depending on a control signal received from digital loop 630, the array of resistors adjusts its settings accordingly by activating and de-activating resistors $612_1$-$612_N$ and 613 via switches $614_1$-$614_N$. In an embodiment, array of resistors $612_1$-$612_N$ and 613 are polysilicon resistors, where each resistor has substantially identical resistance values.

Further, in an embodiment, switches $614_1$-$614_N$ are digital switches to couple array of resistors $612_1$-$612_N$ and 613 to a supply voltage of phase interpolator 610 (e.g., VDD) such that resistors $612_1$-$612_N$ and 613 are configured in parallel with PMOS device 611. The control of switches $614_1$-$614_N$ will be described in detail below with respect to digital loop 630. PMOS device 611 provides a fine resistance setting for phase interpolator 610 such that, depending on its gate voltage, a resistance of PMOS device 611 adjusts accordingly. The gate voltage of PMOS device 611 is controlled by analog loop 620 and will be described in detail below. The finely-controlled analog PMOS device 611 is placed in parallel with the coarse digitally-controlled resistors $612_1$-$612_N$ and 613 to set an overall resistor load for phase interpolator 610.

As indicated by equation (3) above, the load resistance (e.g., R) of phase interpolator 610 should be adjusted to be inversely proportional to operating frequency (e.g., f). Thus, for a wide range of operating frequencies, it is desirable for the load resistance to vary with frequency.

To facilitate in the explanation of the present invention with respect to varying the load device of phase interpolator 610 with analog loop 620 and digital loop 630, a few design parameters will be defined. The voltage across PMOS device 611 can be assumed to be 0.5V (i.e., $V_R$=0.5V), where it provides sufficient output swing such that no devices enter triode region. An upper bound gate voltage for PMOS device 611 can be defined as the supply voltage of phase interpolator 610 (e.g., $V_{DD}$=1.2V) minus a threshold voltage of PMOS device 611 (e.g., $V_{THP}$=0.3V) because a gate voltage higher than this value shuts off PMOS device 611. Conversely, a lower bound gate voltage for PMOS device 611 can be determined by the ability of a comparator 621 in analog loop 620 to output a voltage that is below the lower bound gate voltage as well as the ability of digital comparators $631_1$-$631_4$ in digital loop 630 to detect the lower bound gate voltage. For ease of explanation, this lower bound voltage can be assumed to be 0.15V (e.g., $V_{LOWER}$=0.15V). A person of ordinary skill in the relevant art will recognize that the design parameters defined above are for explanation purposes only and that these parameters can vary according to a particular design.

In referring to FIG. 6, analog loop 620 includes comparator 621 and a low pass filter 622. Low pass filter 622 includes a resistor 623 and a capacitor 624. Capacitor 624 is coupled to an output of comparator 621 for frequency stability purposes. Frequency stability techniques for operational amplifiers (e.g., comparators) are known to those persons of ordinary skill in the relevant art. Further, low pass filter 622 establishes a loop bandwidth of analog loop 620 where, for a constant value of capacitor 624, resistor 623 can be adjusted to set the loop bandwidth. It is desirable to avoid an interaction between analog loop 620 and digital loop 630 and as such, in an embodiment, a value of resistor 623 is chosen so that analog loop 620 has a lower loop bandwidth than digital loop 630.

Comparator 621 controls the gate voltage of PMOS device 611 and thus the resistance of PMOS device 611. The goal of comparator 620 is to maintain a constant voltage across PMOS device 611 (e.g., $V_R$=0.5V). In doing so, an input $621_1$ to comparator 621 is coupled to a reference voltage equal to the supply voltage of phase interpolator 610 minus the desired voltage across PMOS device 611 (e.g., $V_{621,1}$=$V_{DD}$−$V_R$=1.2V−0.5V=0.7V). Another input $621_2$ to comparator 621 is coupled to a drain/source terminal of PMOS device 611. At a convergence point, the gate voltage of PMOS device 611 (e.g., $V_{BP}$) is expected to be between the upper bound gate voltage (e.g., $V_{UPPER}$=0.9V) and the lower bound gate voltage (e.g., $V_{LOWER}$=0.15V) of PMOS device 611. If $V_{BP}$ is higher than $V_{UPPER}$, PMOS device 611 shuts OFF, indicating that the resistance of array of resistors $612_1$-$612_N$ and 613 is too low. On the other hand, if $V_{BP}$ is lower than $V_{LOWER}$, PMOS device 611 has a high "gate drive," indicating that the resistance of array of resistors $612_1$-$612_N$ and 613 is too high.

In referring to FIG. 6, digital loop 630 includes a plurality of comparators $631_1$-$631_4$, AND logic devices $632_1$ and $632_2$, and a digital counter 633. As described above with respect to low pass filter 622, it is desirable to avoid an interaction between analog loop 620 and digital loop 630. This goal can be achieved by increasing the loop bandwidth of digital loop 630 by adding a set of comparators $631_3$ and $631_4$ to a fast-moving path (e.g., $V_{BP,FAST}$) in parallel with the slow-moving path (e.g., $V_{BP}$) that includes comparators $631_1$ and $631_2$.

In referring to FIG. 6, digital loop 630 compares the output of comparator 621, $V_{BP,FAST}$ and $V_{BP}$, with the upper and lower bound gate voltages of PMOS device 611 (i.e., $V_{UPPER}$ and $V_{LOWER}$) to assess, in a coarse manner, whether the resistance of array of resistors $612_1$-$612_N$ and 613 is too large or too small. In adjusting array of resistors $612_1$-$612_N$ and 613 based on whether resistance is too high or too low, digital counter 633 increments or decrements a number of active resistors in array of resistors $612_1$-$612_N$ and 613 via switches $614_1$-$614_N$ (e.g., configuring resistors in parallel with PMOS device 611).

For instance, in assuming that the voltage across PMOS device 611 becomes greater than 0.5V (i.e., $V_R$>0.5V), the voltage on node $V_{BP,FAST}$ decreases accordingly since $V_{BP,FAST}$ tracks $V_{FB}$ (i.e., $V_{BP,FAST} \propto V_{FB}$ and $V_{FB}$=$V_{DD}$−$V_R$). As $V_{BP,FAST}$ decreases below $V_{LOWER}$ (e.g., 0.15V), comparator $631_4$ generates a HIGH or logical '1' output. Similarly, after a time delay due to low pass filter 622, $V_{BP}$ also decreases below $V_{LOWER}$, in which thereafter, comparator $631_2$ generates a HIGH or logical '1' output.

The outputs from comparators $631_2$ and $631_4$ are received by AND logic device $632_2$, which outputs a HIGH (e.g., logical '1') or LOW (e.g., logical '0') depending on its inputs. In an embodiment, if the output of AND logic device $632_2$ is a HIGH, then this indicates to increment digital counter 633.

Digital counter 633 and the control of switches $614_1$-$614_N$ based on an output of digital counter 633 will be described in detail below with respect to digital counter 633.

Conversely, in assuming that the voltage across PMOS device 611 becomes less than 0.5V (i.e., $V_R$<0.5V), the voltage on node $V_{BP,FAST}$ increases accordingly. As $V_{BP,FAST}$ increases above $V_{UPPER}$ (e.g., 0.9V), comparator $631_3$ generates a HIGH or logical '1' output. Similarly, after a time delay due to low pass filter 622, $V_{BP}$ also increases above $V_{UPPER}$, in which thereafter, comparator $631_1$ generates a HIGH or logical '1' output. The outputs from comparators $631_1$ and $631_3$ are received by AND logic device $632_1$, which outputs a HIGH (e.g., logical '1') or LOW (e.g., logical '0') depending on its inputs. In an embodiment, if the output of AND logic device $632_1$ is a HIGH, then this indicates to decrement digital counter 633.

In referring to FIG. 6, digital counter 633 increments or decrements a number of active resistors in array of resistors $612_1$-$612_N$ and 613 via switches $614_1$-$614_N$. Digital counter 633 only changes its output (e.g., to decrement or increment) when $V_{BP}$ and $V_{BP,FAST}$ are simultaneously the same value. In an embodiment, if digital counter receives a HIGH signal from AND logic device $632_2$, indicating an increment function, then digital counter 633 activates resistors from array of resistors $612_1$-$612_N$ and 613 in order to reduce the overall load resistance of phase interpolator 610. In other words, digital counter 633 sends a control signal to switches $614_1$-$614_N$ to configure their respective resistors in parallel with PMOS device 611, thus reducing the overall load resistance of phase interpolator 610, as well as voltage across PMOS device 611.

In an embodiment, as long as the signal indicating an increment function from AND logic device $632_2$ is HIGH, digital counter 633 continues to activate switches $614_1$-$614_N$ one at a time at a particular clock frequency 634, thus placing additional resistors in parallel with PMOS device 611. Digital counter 633 discontinues the activation of resistors in array of resistors $612_1$-$612_N$ and 613 when the output of AND logic device $632_2$ is LOW (e.g., $V_{BP,FAST}$ is greater than $V_{LOWER}$). More specifically, when $V_{BP,FAST}$ reaches the lower bound gate voltage for PMOS device 611 (e.g., $V_{LOWER}$=0.15V), AND logic device $632_2$ changes its output from HIGH to LOW since comparator $631_4$ quickly changes its output according to $V_{BP,FAST}$, thus communicating to digital counter 633 to cease the increment function. At this point, $V_{BP}$ adjusts the gate voltage of PMOS device 611 to fine tune the resistance of PMOS device 611 and slowly converges to $V_{BP,FAST}$ (due to a time delay associated with low pass filter 622). During this fine tune period, the output of digital loop 630 is frozen and, therefore, an interaction between analog loop 620 and digital loop 630 is avoided. As a result, the scheme described above with respect to combining a fast (e.g., $V_{BP,FAST}$) and a slow path (e.g., $V_{BP}$) minimizes a time associated with freezing digital loop 630 and a long observation time for lock detection as compared to conventional implementations.

In an embodiment, in decrementing a number of active resistors from array of resistors $612_1$-$612_N$ and 613, digital counter 633 receives a HIGH signal from AND logic device $632_1$. In decrementing the number of active resistors, digital counter 633 sends a control signal to switches $614_1$-$614_N$ to disconnect their respective resistors in parallel with PMOS device 611, thus increasing the overall load resistance of phase interpolator 610, as well as the voltage across PMOS device 611.

In an embodiment, as long as the signal indicating a decrement function from AND logic device $632_1$ is HIGH, digital counter 633 continues to de-activate switches $614_1$-$614_N$ one at a time at clock frequency 634, thus placing less resistors in parallel with PMOS device 611. Digital counter 633 discontinues the de-activation of resistors in array of resistors $612_1$-$612_N$ and 613 when the output of AND logic device $632_1$ is LOW (i.e., $V_{BP,FAST}$ less than $V_{UPPER}$). More specifically, when $V_{BP,FAST}$ reaches the upper bound gate voltage for PMOS device 611 (e.g., $V_{UPPER}$=0.9V), AND logic device $632_1$ changes its output from HIGH to LOW since comparator $631_3$ quickly changes its output according to $V_{BP,FAST}$, thus communicating to digital counter 633 to cease the decrement function. At this point, $V_{BP}$ adjusts the gate voltage of PMOS device 611 to fine tune the resistance of PMOS device 611 and slowly converges to $V_{BP,FAST}$ (due to the time delay associated with low pass filter 622).

Figure 7:
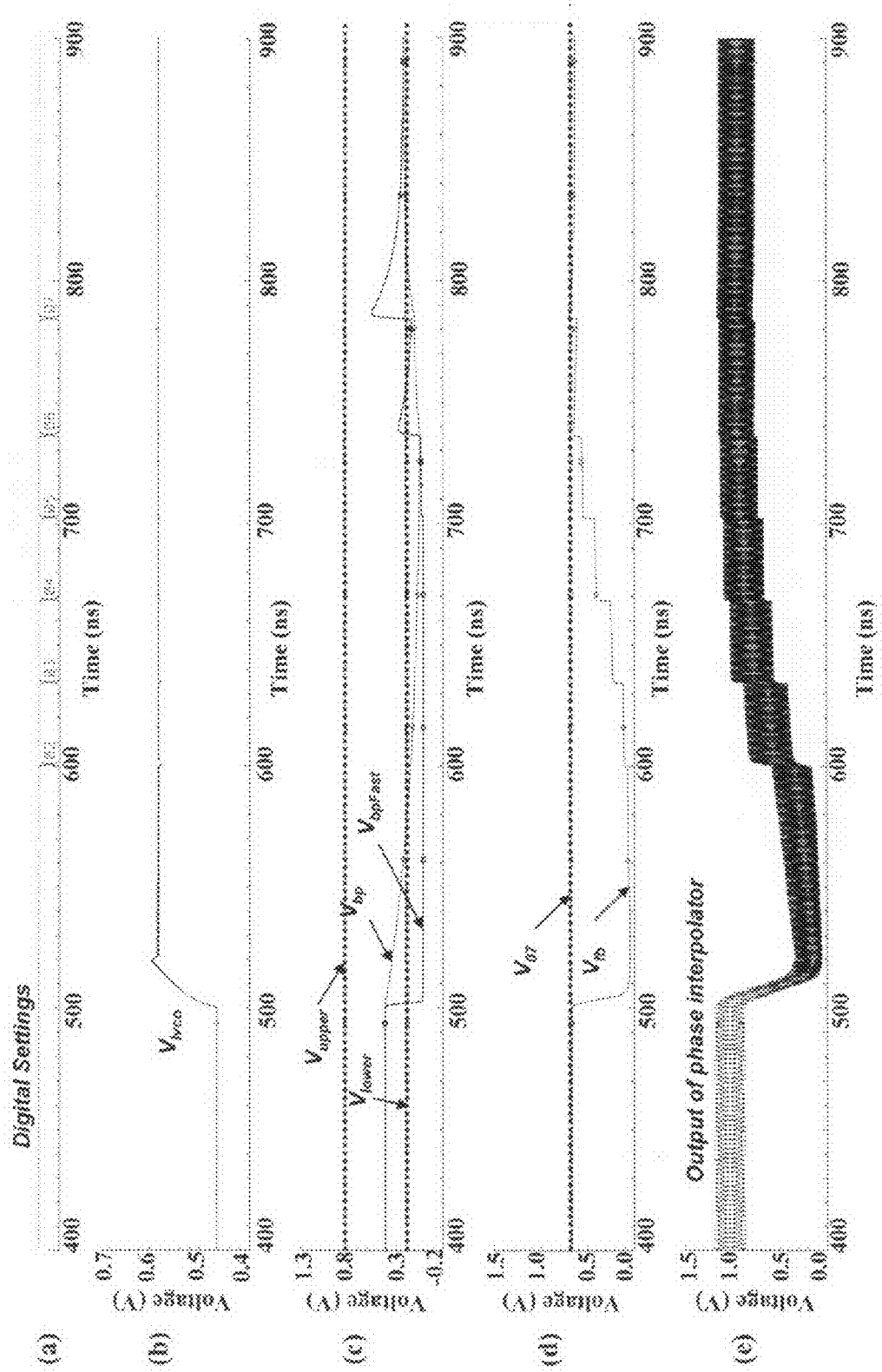
FIG. 7(a) is an example graph of an output signal from a digital counter in accordance with the present invention.
FIG. 7(b) is an example graph of a bias voltage signal of a current source in a phase interpolator transitioning from one voltage to another voltage value in accordance with the present invention.
FIG. 7(c) is an example graph of two internal signals in a phase interpolator in relation to a predetermined upper and lower voltage in accordance with the present invention.
FIG. 7(d) is an example graph of an internal signal in a phase interpolator in relation to a predetermined optimal voltage for an output swing of a phase interpolator in accordance with the present invention.
FIG. 7(e) is an example graph of an output signal of a phase interpolator in accordance with the present invention.

To facilitate an explanation of a high-level operation of apparatus 600, FIGS. 7(a)-(e) is an illustration of example graphs of various nodes in apparatus 600 when a bias voltage 616 of a current source in phase interpolator 610 transitions from one voltage to another voltage value. These figures show the convergence characteristics of different nodes in phase interpolator 610 as apparatus 600 settles to a steady state. FIG. 7(a) is an illustration of an example graph of an output signal from digital counter 633. FIG. 7(b) is an illustration of an example graph of bias voltage signal 616 transitioning from one voltage to another voltage value. FIG. 7(c) is an illustration of an example graph $V_{BP}$ and $V_{BP,FAST}$ signals in relation to $V_{UPPER}$ and $V_{LOWER}$ signals during the transition of bias voltage signal 616. FIG. 7(d) is an illustration of an example graph of $V_{FB}$ signal in relation to a predetermined optimal voltage signal for an output swing of phase interpolator 610 (e.g., $V_{O7}$). FIG. 7(e) is an illustration of an example graph of an output signal of phase interpolator 610. The time scale, voltages, and performance characteristics shown in FIGS. 7(a)-(e) are for explanation purposes only and thus a person of ordinary skill in the relevant art will recognize that the time scale, voltages, and performance characteristics of the nodes shown in FIGS. 7(a)-(e) are design specific.

Prior to 500 ns, no change in bias voltage 616 has occurred and thus $V_{BP}$, $V_{BP,FAST}$, and $V_{FB}$ are at steady state voltage levels, where these voltages are between $V_{UPPER}$ and $V_{LOWER}$. At 500 ns, bias voltage 616 transitions from approximately 460 to 580 mV as illustrated in FIG. 7(b). The higher bias voltage increases current through the load device of phase interpolator 610, thus decreasing $V_{FB}$ due to an increase in voltage drop across the load device. $V_{BP,FAST}$ quickly tracks the decrease in $V_{FB}$ and falls below $V_{LOWER}$ as illustrated in FIG. 7(c). Due to low pass filter 622, $V_{BP}$ slowly converges to the voltage level of $V_{BP,FAST}$.

Prior to $V_{BP}$ converging with $V_{BP,FAST}$, at approximately 575 ns, $V_{BP}$ falls below $V_{LOWER}$. At this point, the output of AND logic device $632_2$ is HIGH, thus activating an increment function from digital counter 633. FIG. 7(a) illustrates a beginning of the increment function from digital counter 633 at approximately 600 ns. The clock frequency of digital counter 633 is approximately 30 MHz (e.g., digital counter increments an active resistor from array of resistors $612_1$-$612_N$ and 613 approximately every 35 ns). For instance, between approximately 600 and 635 ns, digital counter 633 increments by one count which, in turn, translates into a resistor from array of resistors $612_1$-$612_N$ and 613 switched into a configuration that is parallel to PMOS device 611. Further, between approximately 635 and 670 ns, another resistor is switched into a configuration that is parallel to PMOS device 611.

As digital counter 633 switches additional resistors in parallel with PMOS device 611, the overall load resistance of phase interpolator 610 decreases thus raising the voltage of $V_{FB}$. This rise in voltage of $V_{FB}$ is illustrated in FIG. 7(d) between 600 and 800 ns. In referring to FIG. 7(c), $V_{BP,FAST}$ does not begin to rise in voltage level until approximately 700 ns because the overall load resistance of phase interpolator 610 is not low enough until enough number of resistors 612$_1$-612$_N$ and 613 are activated.

At approximately 740 ns, the digital setting in FIG. 7(c) increases to [06], 1 LSB away from a final value. Here, the analog loop responds to nearing the final value, where $V_{BP,FAST}$ oscillates above and below $V_{LOWER}$ between 740 and 790 ns as illustrated in FIG. 7(c). Digital counter 633 discontinues its increment function as $V_{BP,FAST}$ rises above $V_{LOWER}$ (i.e., output of AND logic device 632$_2$ is LOW) and continues the increment function as $V_{BP,FAST}$ falls below $V_{LOWER}$ (i.e., output of AND logic device 632$_2$ is HIGH).

At approximately 835 ns, $V_{BP}$ and $V_{BP,FAST}$ have converged and are both above $V_{LOWER}$. At this point, digital counter 633 has discontinued its increment function since the output of AND logic device 632$_2$ is LOW. Further, $V_{FB}$ is approximately 0.7V, thus maintaining an optimal output swing for phase interpolator 610.

In sum, apparatus 600 combines analog and digital techniques to take advantage of the wide tuning range of the digital control and the smooth, continuous output of the analog control. By combining analog and digital controls, device matching and parasitic requirements in circuit designs can be relaxed. The hybrid feedback design, incorporating the analog and digital loops as illustrated in FIG. 6, provides a solution to avoid interaction between these two types of loops and thus guarantees stability. In light of the description herein, a person of ordinary skill in the relevant art will appreciate that the hybrid analog/digital loop configuration described with respect to apparatus 600 in FIG. 6 can be applied to a wide range of applications with both analog and digital control, such as PLL, CDR, and duty cycle control designs. These other types of applications are within the scope and spirit of the present invention.

Figure 8:
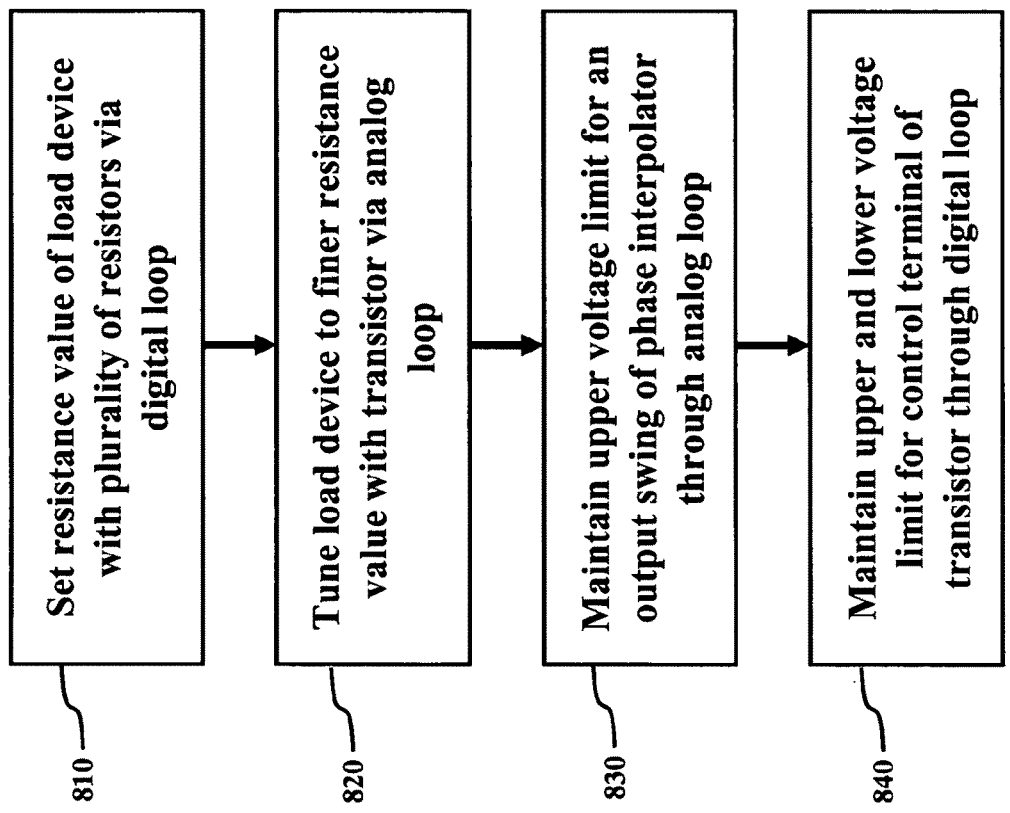
FIG. 8 is an illustration of an embodiment of a method for scaling a load device with frequency in a phase interpolator in accordance with the present invention.

FIG. 8 is an illustration of an embodiment of a method 800 for scaling a load device with frequency in a phase interpolator in accordance with the present invention. Method 800 may occur, for example, using apparatus 600. In step 810, a resistance value of a plurality of resistors in the load device is set, where the plurality of resistors are controlled by a digital loop. In an embodiment, the resistance of the load device is set by selectively coupling the plurality of resistors to source and drain terminals of a PMOS device in a parallel configuration via digital switches. Array of resistors 612$_1$-612$_N$ and switches 614$_1$-614$_N$ can be used, for example, for step 810.

In step 820, the resistance of the load device in the phase interpolator is tuned to a finer resistance value than the resistance set by the plurality of resistors with a transistor whose resistance is controlled by an analog loop. In an embodiment, a PMOS device is used as the transistor such that a voltage at a source/drain terminal of the PMOS device can be compared to a reference voltage. The reference voltage can equal a supply voltage of the phase interpolator (e.g., $V_{DD}$=1.2V) minus a predetermined voltage across the PMOS device (e.g., $V_R$=0.5V). For example, the predetermined voltage across the transistor can be set according to a design-specific voltage output swing of the phase interpolator.

In step 830, an upper voltage limit for an output swing of the phase interpolator is maintained through the analog loop. In an embodiment, the upper voltage limit is attained by monitoring a voltage across the transistor such that an optimal voltage is maintained for an output swing of the phase interpolator.

In step 840, an upper and lower voltage limit for a control terminal of the transistor is maintained through the digital loop. In an embodiment, this step includes three steps. First, an output of a comparator coupled to the analog loop can be compared to both an upper and lower voltage limit of a gate voltage of a PMOS device. Here, the PMOS device provides the finer resistance value for the load device of the phase interpolator. Second, a time-delayed version of the output of the comparator coupled to the analog loop can be compared to both the upper and lower voltage limits of the gate voltage of the PMOS device. The time delay can be attributed to a RC filter, or low pass filter, that is coupled to an output of a comparator. Third, a cycle count from an output from a digital counter can be incremented or decremented based on the two comparisons described above. For example, based on the two comparisons, the output of the digital counter can send a control signal to an array of resistors (e.g., array of resistors 612$_1$-612$_N$ and 613 in FIG. 6) to configure one or more resistors in parallel with the PMOS device (e.g., PMOS device 611 in FIG. 6) such that the resistance of the load device is reduced. Conversely, based on the two comparisons, the output of the digital counter can send a control signal to the array of resistors to configure a removal of one or more resistors in parallel with the PMOS device such that the resistance of the load device is increased.

Figure 9:
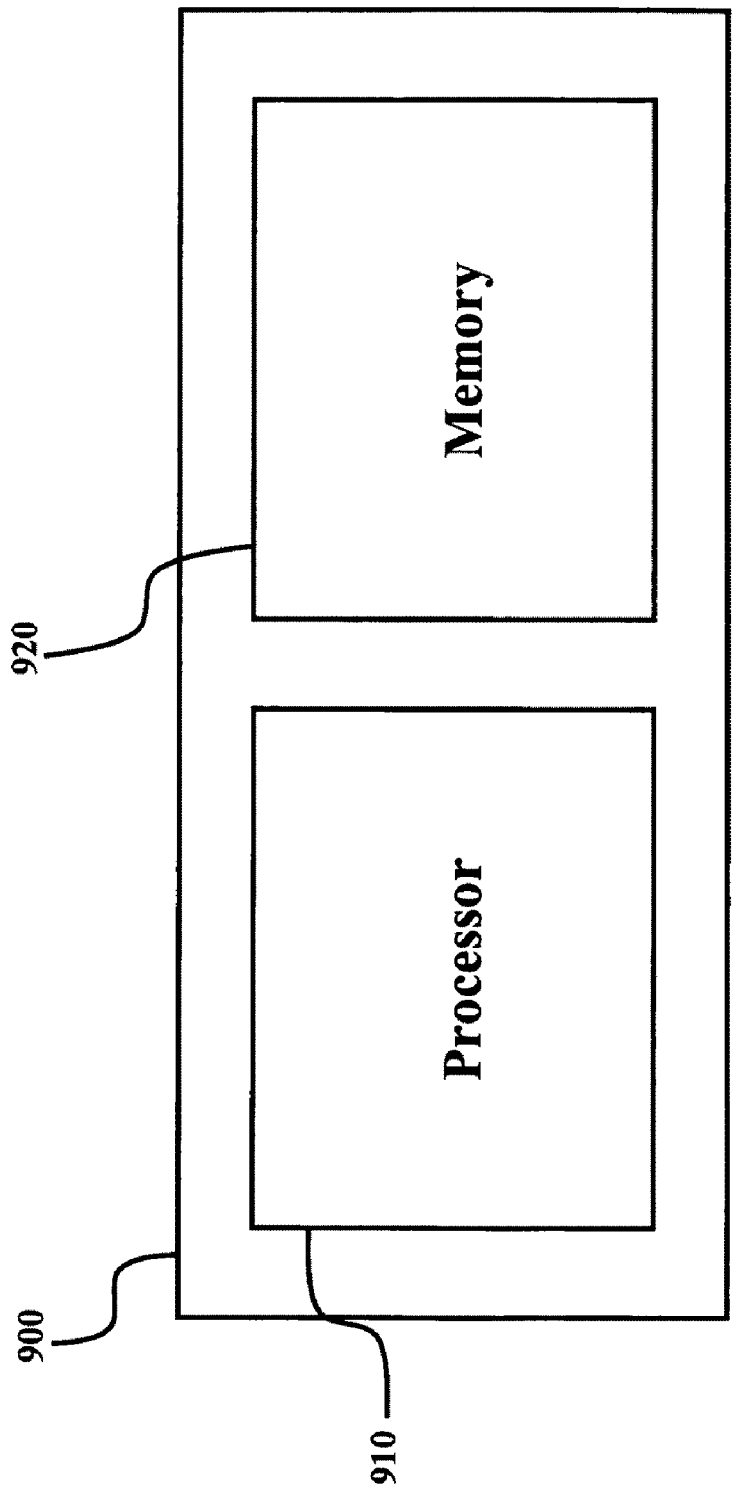
FIG. 9 is an illustration of an embodiment of a system for scaling a load device with frequency in a phase interpolator in accordance with the present invention.

FIG. 9 is an illustration of an embodiment of a system 900 for scaling a load device with frequency in a phase interpolator in accordance with the present invention.

System 900 includes a processor 910 and a memory 920. Memory 920 is in communication with processor 910 and stores processing instructions (also referred to computer program code and computer program product). In an embodiment of the present invention, these processing instructions direct processor 910 to perform the following functions: (1) set a resistance value of a plurality of resistors in the load device, where the plurality of resistors are controlled by a digital loop; (2) tune the resistance of the load device to a finer resistance value than the resistance set by the plurality of resistors with a transistor whose resistance is controlled by an analog loop; (3) maintain a predetermined voltage for an output swing of the phase interpolator through the analog loop; and, (4) maintain an upper and lower voltage limit for a control terminal of the transistor through the digital loop.

In an embodiment, the instructions for directing the processor to set the load resistance of the load device include instructions for directing the processor to selectively couple the plurality of resistors to source and drain terminals of a PMOS device in a parallel configuration via digital switches. The selective coupling of the plurality of resistors via digital switches can be used as a means to provide a coarse resistance setting such that circuit area and associated parasitics can be reduced in the phase interpolator design.

In an embodiment, the instructions for directing the processor to tune the resistance of the load device include instructions for directing the processor to compare a voltage at a source/drain terminal of a PMOS device to a reference voltage. The reference voltage can equal a supply voltage of the phase interpolator (e.g., $V_{DD}$=1.2V) minus a predetermined voltage drop across the PMOS device (e.g., $V_R$=0.5V). The comparison of the source/drain voltage to the reference voltage can be used as a means to provide a finer resistance value than the resistance set by the plurality of resistors, where the PMOS device can occupy a small circuit area since it is used to cover a small fraction of the load device's tuning range.

In an embodiment, the instructions for directing the processor to maintain the upper voltage limit for the output swing include instructions for directing the processor to monitor a voltage across the transistor. As such, an optimal voltage can be maintained for an output swing of the phase interpolator. In many circuit designs, a large output swing is desirable so that the circuit can operate in a wider range of input conditions, while no device enters a triode region of operation.

In an embodiment, the instructions for directing the processor to maintain the upper and lower voltage limits for the control terminal include instructions for directing the processor to perform the following: (1) compare an output of a comparator coupled to the analog loop to both an upper and lower voltage limit of a gate voltage of a PMOS device, where the PMOS device provides the finer resistance value; (2) compare a time-delayed version of the output of the comparator coupled to the analog loop to both the upper and lower voltage limits of the gate voltage of the PMOS device; and, (3) incrementing or decrementing a cycle count from an output of a digital counter coupled to the digital loop based on the two comparisons described above.

The foregoing description of the specific embodiments will so fully reveal the general nature of the invention such that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Accordingly, the breadth and scope of the present invention should not be limited by any of the above-described exemplary embodiments, but should be defined only in accordance with the following claims and their equivalents.

What is claimed is:

1. An apparatus for scaling a load device with frequency in a phase interpolator, comprising:
    an analog loop to control a resistance of a transistor in the load device based on a voltage applied to a control terminal of the transistor; and
    a digital loop, in conjunction with the analog loop, to control a plurality of resistors in the load device, the plurality of resistors selectively coupled to the transistor, wherein the transistor is arranged in a parallel configuration with at least one resistor of the plurality of resistors to form a common output for the load device.

2. The apparatus of claim 1, further comprising:
    one or more current sources coupled to both the transistor and plurality of resistors.

3. The apparatus of claim 1, wherein the analog loop comprises:
    a comparator to compare a voltage across the transistor to a reference voltage such that an optimal voltage is maintained for an output swing of the phase interpolator; and
    a low pass filter coupled to an output of the comparator, the low pass filter including a resistor and a capacitor to define a frequency stability and loop bandwidth of the analog loop.

4. The apparatus of claim 1, wherein the digital loop comprises:
    a plurality of second comparators to compare a voltage from an output of a first comparator, coupled to the analog loop, to a first and second reference voltage;
    a plurality of third comparators to compare a time-delayed version of the output of the first comparator to the first and second reference voltages; and
    a digital counter to increment or decrement a number of the plurality of resistors coupled to the transistor, via digital switches, based on outputs from the plurality of first comparators and the plurality of second comparators.

5. The apparatus of claim 1, wherein the transistor comprises a p-channel metal oxide semiconductor (PMOS) device whose resistance is tuned by a voltage applied to its gate terminal.

6. The apparatus of claim 1, wherein the plurality of resistors comprise polysilicon resistors.

7. The apparatus of claim 1, wherein the transistor comprises a PMOS device and digital switches are used to selectively couple the plurality of resistors to source and drain terminals of the PMOS device in a parallel configuration.

8. The apparatus of claim 3, wherein the reference voltage comprises an upper voltage limit for an output swing of the phase interpolator.

9. The apparatus of claim 4, wherein the first and second reference voltages comprise an upper and lower voltage limit, respectively, for a gate voltage of a PMOS device.

10. The apparatus of claim 1, wherein the digital loop operates simultaneously with the analog loop.

11. A method for scaling a load device with frequency in a phase interpolator, comprising:
    (a) setting a resistance value of a plurality of resistors in the load device, the plurality of resistors selectively controlled by a digital loop; and
    (b) tuning the resistance of the load device to a finer resistance value than the resistance set by the plurality of resistors with a transistor whose resistance is controlled by an analog loop, wherein the transistor is arranged in a parallel configuration with at least one resistor of the plurality of resistors to form a common output for the load device.

12. The method of claim 11, further comprising:
    (c) maintaining a predetermined value for an output swing of the phase interpolator through the analog loop; and
    (d) maintaining an upper and lower voltage limit at the control terminal of the transistor through the digital loop.

13. The method of claim 11, wherein the transistor comprises a PMOS device and step (a) comprises selectively coupling the plurality of resistors to source and drain terminals of the PMOS device in a parallel configuration via digital switches.

14. The method of claim 11, wherein step (b) comprises comparing a voltage at a source/drain terminal of a PMOS device to a reference voltage, the reference voltage equaling an output swing of the phase interpolator.

15. The method of claim 12, wherein step (c) comprises monitoring a voltage across the transistor such that an optimal voltage is maintained for an output swing of the phase interpolator.

16. The method of claim 12, wherein step (d) comprises:
    (d1) comparing an output of a comparator coupled to the analog loop to both an upper and lower voltage limit of a gate voltage of a PMOS device, the PMOS device providing the finer resistance value;
    (d2) comparing a time-delayed version of the output of the comparator coupled to the analog loop to both the upper and lower voltage limits of the gate voltage of the PMOS device; and (d3) incrementing or decrementing a cycle count from an output of a digital counter coupled to the digital loop based on the results of steps (d1) and (d2).

17. A system for scaling a load device with frequency in a phase interpolator, comprising:
  a processor;
  a memory in communication with the processor, the memory for storing a plurality of processing instructions for directing the processor to:
  set a resistance value of a plurality of resistors in the load device, the plurality of resistors controlled by a digital loop; and
  tune the resistance of the load device to a finer resistance value than the resistance set by the plurality of resistors with a transistor whose resistance is controlled by an analog loop, wherein the transistor is arranged in a parallel configuration with at least one resistor of the plurality of resistors to form a common output for the load device.

18. The system of claim 17, further comprising a memory in communication with the processor, the memory for storing a plurality of processing instructions for directing the processor to:
  maintain a predetermined output swing of the phase interpolator through the analog loop; and
  maintain an upper and lower voltage limit for a control terminal of the transistor through the digital loop.

19. The system of claim 17, wherein the transistor comprises a PMOS device and the instructions for directing the processor to set the resistance value of the load device comprise instructions for directing the processor to selectively couple the plurality of resistors to source and drain terminals of the PMOS device in a parallel configuration via digital switches.

20. The system of claim 17, wherein the instructions for directing the processor to tune the resistance of the load device comprise instructions for directing the processor to compare a voltage at a source/drain terminal of a PMOS device to a reference voltage, the reference voltage equaling a supply voltage of the phase interpolator minus a predetermined voltage drop across the PMOS device.

21. The system of claim 18, wherein the instructions for directing the processor to maintain a predetermined value for the output swing comprise instructions for directing the processor to monitor a voltage across the transistor such that an optimal voltage is maintained for an output swing of the phase interpolator.

22. The system of claim 18, wherein the instructions for directing the processor to maintain the upper and lower voltage limits for the control terminal comprise instructions for directing the processor to:
  compare an output of a comparator coupled to the analog loop to both an upper and lower voltage limit of a gate voltage of a PMOS device, the PMOS device providing the finer resistance value;
  compare a time-delayed version of the output of the comparator coupled to the analog loop to both the upper and lower voltage limits of the gate voltage of the PMOS device; and
  incrementing or decrementing a cycle count from an output of a digital counter coupled to the digital loop based on the results of the comparison of the output of the comparator to both the upper and lower voltage limits of the gate voltage and the comparison of the time-delayed version of the output of the comparator to both the upper and lower voltage limits of the gate voltage of the PMOS device.

23. The apparatus of claim 1, wherein the plurality of resistors are arranged in a parallel configuration with each other.

24. The apparatus of claim 1, further comprising:
  an input transistor coupled to both the transistor and plurality of transistors, wherein the input transistor is configured to receive a phase input signal; and
  a current source coupled to the input transistor, wherein the current source comprises a plurality of transistors arranged in a cascaded configuration.

25. A method for scaling a load device with frequency in a phase interpolator, comprising:
  (a) setting a resistance value of a plurality of resistors in the load device, the plurality of resistors selectively controlled by a digital loop;
  (b) tuning the resistance of the load device to a finer resistance value than the resistance set by the plurality of resistors with a transistor whose resistance is controlled by an analog loop;
  (c) maintaining a predetermined value for an output swing of the phase interpolator through the analog loop; and
  (d) maintaining an upper and lower voltage limit at the control terminal of the transistor through the digital loop.

26. A system for scaling a load device with frequency in a phase interpolator, comprising:
  a processor;
  a memory in communication with the processor, the memory for storing a plurality of processing instructions for directing the processor to:
  set a resistance value of a plurality of resistors in the load device, the plurality of resistors controlled by a digital loop;
  tune the resistance of the load device to a finer resistance value than the resistance set by the plurality of resistors with a transistor whose resistance is controlled by an analog loop;
  maintain a predetermined output swing of the phase interpolator through the analog loop; and
  maintain an upper and lower voltage limit for a control terminal of the transistor through the digital loop.

* * * * *